(12) United States Patent
Hanawa et al.

(10) Patent No.: US 9,722,201 B2
(45) Date of Patent: *Aug. 1, 2017

(54) ORGANIC ELECTROLUMINESCENCE DEVICE AND METHOD OF MANUFACTURING THE SAME

(71) Applicant: Sony Corporation, Tokyo (JP)

(72) Inventors: Koji Hanawa, Kanagawa (JP); Jiro Yamada, Kanagawa (JP); Takashi Hirano, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/967,548

(22) Filed: Dec. 14, 2015

(65) Prior Publication Data

US 2016/0233454 A1 Aug. 11, 2016

Related U.S. Application Data

(63) Continuation of application No. 14/567,290, filed on Dec. 11, 2014, now Pat. No. 9,240,564, which is a
(Continued)

(30) Foreign Application Priority Data

Aug. 31, 2001 (JP) ................................ 2001-264410

(51) Int. Cl.
*H01J 1/62* (2006.01)
*H01J 63/04* (2006.01)
(Continued)

(52) U.S. Cl.
CPC ............ *H01L 51/5218* (2013.01); *C22C 5/06* (2013.01); *C22C 5/08* (2013.01); *H01L 51/5012* (2013.01);
(Continued)

(58) Field of Classification Search
CPC ............ H01L 51/5218; H01L 51/5012; H01L 51/5088; H01L 51/5206; H01L 51/5221;
(Continued)

(56) References Cited

U.S. PATENT DOCUMENTS 4,940,505 A 7/1990 Schachameyer et al.
5,443,922 A 8/1995 Nishizaki et al.
(Continued)

FOREIGN PATENT DOCUMENTS

CA 2313767 1/2001
EP 0616488 9/1994
(Continued)

OTHER PUBLICATIONS

European Search Report issued May 18, 2009, for European Appln. No. 02736178.1.

*Primary Examiner* — Anh Mai
*Assistant Examiner* — Glenn Zimmerman
(74) *Attorney, Agent, or Firm* — K&L Gates LLP

(57) ABSTRACT

Provided are an organic electroluminescence device capable of enhancing reflectance of an anode, thereby resulting in improved light-emitting efficiency and a method of manufacturing the same. An anode (12), a thin film layer for hole injection (13), an insulating layer (14), an organic layer (15) including a luminescent layer (15C) and a cathode (16) including a semi-transparent electrode (16A) are laminated in order on a substrate (11). The anode (12) comprises silver which is a metal with high reflectance or an alloy including silver, and the thin film layer for hole injection (13) comprises chromium oxide or the like. Light generated in the luminescent layer (15C) is multiply reflected between the anode (12) and the semi-transparent electrode (16A) to be emitted from the cathode (16). As the reflectance of the anode (12) is enhanced, the light generated in the lumines-
(Continued)

cent layer (15C) can be efficiently emitted. An alloy comprised in the anode (12) preferably includes silver, palladium and copper, and a silver content is preferably 50% by mass or over.

24 Claims, 5 Drawing Sheets

Related U.S. Application Data continuation of application No. 11/899,431, filed on Sep. 6, 2007, now Pat. No. 8,937,428, which is a continuation of application No. 10/399,030, filed as application No. PCT/JP02/06354 on Jun. 25, 2002, now Pat. No. 7,285,905.

(51) Int. Cl.
  *H01L 51/52* (2006.01)
  *H01L 51/50* (2006.01)
  *C22C 5/06* (2006.01)
  *C22C 5/08* (2006.01)

(52) U.S. Cl.
  CPC ...... *H01L 51/5088* (2013.01); *H01L 51/5206* (2013.01); *H01L 51/5221* (2013.01); *H01L 51/5225* (2013.01); *H01L 51/5231* (2013.01); *H01L 51/5234* (2013.01); *H01L 51/5265* (2013.01); *H01L 51/5262* (2013.01); *H01L 2251/301* (2013.01); *H01L 2251/308* (2013.01); *H01L 2251/5315* (2013.01)

(58) Field of Classification Search
  CPC ............. H01L 51/5225; H01L 51/5231; H01L 51/5234; H01L 51/5265; H01L 51/5262; H01L 2251/301; H01L 2251/306; H01L 2251/5315; C22C 5/06; C22C 5/08
  USPC .............. 313/504, 506, 512; 445/24; 427/66
  See application file for complete search history.

(56) References Cited

U.S. PATENT DOCUMENTS

| | | | |
|---|---|---|---|
| 5,703,436 A | 12/1997 | Forrest et al. | |
| 5,780,174 A | 7/1998 | Tokito et al. | |
| 5,981,092 A | 11/1999 | Arai et al. | |
| 5,994,836 A | 11/1999 | Boer et al. | |
| 6,210,817 B1 | 4/2001 | Igarashi | |
| 6,340,537 B1 | 1/2002 | Arai et al. | |
| 6,366,017 B1 | 4/2002 | Antoniadis et al. | |
| 6,489,046 B1 | 12/2002 | Ikeda et al. | |
| 6,559,594 B2 | 5/2003 | Fukunaga et al. | |
| 6,586,155 B2 | 7/2003 | Furuse et al. | |
| 6,617,184 B2 | 9/2003 | Bohler et al. | |
| 6,710,525 B1 | 3/2004 | Lee et al. | |
| 6,723,281 B1 | 4/2004 | Ueno et al. | |
| 6,768,257 B1 | 7/2004 | Yamada et al. | |
| 7,102,282 B1 | 9/2006 | Yamada et al. | |
| 7,285,905 B2 | 10/2007 | Hanawa et al. | |
| 8,937,428 B2 * | 1/2015 | Hanawa | H01L 51/5206 313/504 |
| 9,240,564 B2 * | 1/2016 | Hanawa | H01L 51/5206 |
| 2001/0026125 A1 | 10/2001 | Yamazaki et al. | |
| 2001/0043046 A1 | 11/2001 | Fukanaga | |
| 2001/0045565 A1 | 11/2001 | Yamazaki | |
| 2001/0049153 A1 * | 12/2001 | Tanaka | H01L 51/5231 438/29 |
| 2002/0127429 A1 | 9/2002 | Shirakawa et al. | |
| 2002/0185969 A1 | 12/2002 | Raychaudhuri et al. | |
| 2002/0197392 A1 * | 12/2002 | Endo | H01L 51/0004 427/66 |
| 2003/0015723 A1 | 1/2003 | Sakai et al. | |
| 2003/0038593 A1 | 2/2003 | Aziz et al. | |
| 2003/0171060 A1 | 9/2003 | Hirano et al. | |
| 2006/0175966 A1 | 8/2006 | Yamada et al. | |

FOREIGN PATENT DOCUMENTS

| | | |
|---|---|---|
| EP | 1096568 | 5/2001 |
| EP | 1107335 | 6/2001 |
| EP | 1122800 | 8/2001 |
| EP | 1154676 | 11/2001 |
| JP | 05-041286 | 2/1993 |
| JP | 06-112529 | 4/1994 |
| JP | 06-283271 | 10/1994 |
| JP | 10-289784 | 10/1998 |
| JP | 2000-077190 | 3/2000 |
| JP | 2000-100564 | 4/2000 |
| JP | 2000-147540 | 5/2000 |
| JP | 2001-143864 | 5/2001 |
| JP | 2003-031375 A | 1/2003 |
| WO | 99/39393 | 8/1999 |
| WO | 01/39554 | 5/2001 |
| WO | 02/05971 | 1/2002 |
| WO | 02/15294 | 2/2002 |
| WO | 02/063701 | 8/2002 |

* cited by examiner

ORGANIC ELECTROLUMINESCENCE DEVICE AND METHOD OF MANUFACTURING THE SAME

CROSS REFERENCE TO RELATED APPLICATIONS

The present application is a continuation of U.S. application Ser. No. 14/567,290, filed Dec. 11, 2014, which is a continuation of U.S. application Ser. No. 11/899,431, filed Sep. 6, 2007, which is a continuation of U.S. application Ser. No. 10/399,030, filed Apr. 11, 2003, which is a U.S. National stage of International Application No. PCT/JP02/06354, filed Jun. 25, 2002, which claims priority to and the benefit of Japanese Application Serial No. 2001-264410, filed Aug. 31, 2001, the entire content of each of which is hereby incorporated by reference herein.

TECHNICAL FIELD

The present invention relates to an organic electroluminescence device (organic EL device) comprising one or more organic layers including a luminescent layer between an anode and a cathode, and emitting light generated specifically in the luminescent layer, and a method of manufacturing the same.

BACKGROUND ART

In recent years, organic EL displays using an organic electroluminescence device as an alternative to liquid crystal displays have become a focus of attention. The organic EL displays are of a self-luminous type, so it is considered that the organic EL displays have advantages of a wide viewing angle, low power consumption and adequate response to high-definition high-speed video signals. Therefore, the organic EL displays have been developed to achieve the practical use thereof.

FIG. 6 shows a configuration of the organic electroluminescence device. The organic electroluminescence device comprises an anode 112, an organic layer 115 including a hole injection layer 115A, a hole transport layer 115B and a luminescent layer 115C, and a cathode 116 laminated in this order on a substrate 111. Although light generated in the luminescent layer 115C may be emitted from the substrate 111, as shown in FIG. 6, the light may be emitted from the cathode 116.

When the light is emitted from the cathode 116, it is often the case that the anode 112 comprises a metal such as chromium (Cr), and the cathode 116 comprises a transparent conductive material such as a compound of indium (In), tin (Sn) and oxygen (O) (ITO; indium tin oxide). The light generated in the luminescent layer 115C may be directly emitted through the cathode 116 as indicated by an arrow 117 in FIG. 6, and as indicated by an arrow 118, the light may be reflected on the anode 112 once and then emitted through the cathode 116.

However, conventionally, the anode 112 comprises chromium or the like, so there is a problem that light absorptance by the anode 112 is high, thereby a loss of light emitted after reflected on the anode 112 is large. The absorptance by the anode has a large influence on the organic electroluminescence device. When light emitting efficiency is low, the amount of current required to obtain the same intensity is increased. An increase in the amount of drive current affects on the life of the device, which is a critical problem in the practical use of the organic electroluminescence device.

In view of the foregoing, it is an object to provide an organic electroluminescence device capable of enhancing the reflectance of the anode so as to improve light-emitting efficiency, and a method of manufacturing the same.

DISCLOSURE OF THE INVENTION

An organic electroluminescence device according to the invention comprises one or more organic layers including a luminescent layer between an anode and a cathode, and emits light generated in the luminescent layer from the cathode, wherein the anode comprises silver (Ag) or an alloy including silver.

In a first method of manufacturing an organic electroluminescence device according to the invention, the organic electroluminescence comprises one or more organic layers including a luminescent layer between an anode and a cathode and emits light generated in the luminescent layer from the cathode, and the method comprises the steps of: forming the anode comprising silver or an alloy including silver on a substrate; forming a thin film layer for hole injection made of a material with a higher work function than that of the anode on the anode in an atmosphere of an inert gas; forming the one or more organic layers including the luminescent layer on the thin film layer for hole injection and forming the cathode on the organic layer.

In a second method of manufacturing an organic electroluminescence device according to the invention, the organic electroluminescence comprises one or more organic layers including a luminescent layer between an anode and a cathode and emits light generated in the luminescent layer from the cathode, and the method comprises the steps of: forming the anode comprising silver or an alloy including silver on a substrate; forming a thin film layer for hole injection made of a material with a higher work function than that of the anode on the anode by use of an area mask with an aperture corresponding to an area where the thin film layer for hole injection is intended to be formed; forming the one or more organic layers including the luminescent layer on the thin film layer for hole injection; and forming the cathode on the organic layer.

In the organic electroluminescence device according to the invention, the anode comprises silver with a highest reflectance of all of metals or an alloy including silver, so a loss of light absorption by the anode is reduced, thereby light generated in the luminescent layer can be efficiently emitted.

In the first method of manufacturing an organic electroluminescence device according to the invention, after the anode comprising silver or an alloy including silver is formed on the substrate, on the anode, the thin film layer for hole injection is formed in an atmosphere of an inert gas. Therefore, thin film layer for hole injection prevents the anode from being deteriorated, and the anode can be prevented from being deteriorated during the formation of the thin film layer for hole injection.

In the second method of manufacturing an organic electroluminescence device according to the invention, after the anode comprising silver or an alloy including silver is formed on the substrate, the thin film layer for hole injection is formed on the anode by use of an area mask with an aperture corresponding to an area where the thin film layer for hole injection is intended to be formed. Therefore, the thin film layer for hole injection can prevent the anode from being deteriorated, and etching is not required to form the thin film layer for hole injection, so the anode can be prevented from being deteriorated and deformed due to etching.

BEST MODE FOR CARRYING OUT THE INVENTION

Preferred embodiments of the present invention will be described in more detail below referring to the accompanying drawings.

First Embodiment

Figure 1:
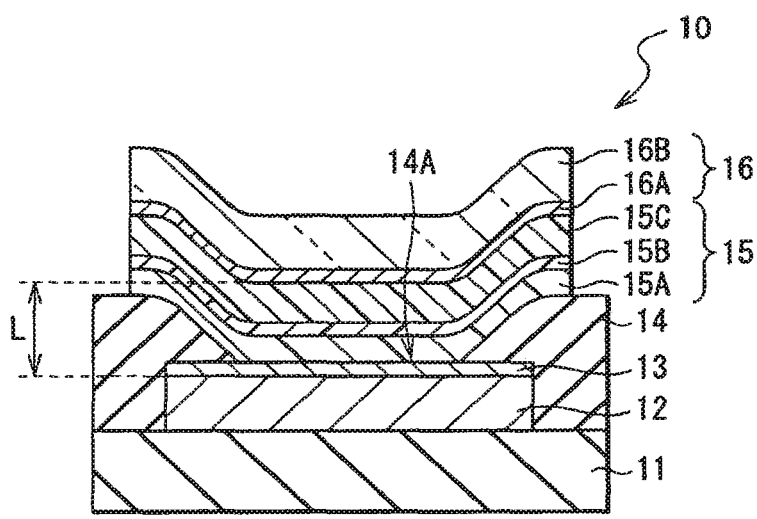
FIG. 1 is a sectional view of a configuration of an organic electroluminescence device according to a first embodiment of the invention.

FIG. 1 shows a sectional configuration of an organic electroluminescence device according to a first embodiment of the invention. An organic electroluminescence device 10, which is used for an extra-thin type organic EL display or the like, comprises an anode 12, a thin film layer for hole injection 13, an insulating layer 14, an organic layer 15 and a cathode 16 which are laminated in this order on a substrate 11 made of, for example, an insulating material such as glass. Further, a passivation film (not shown) is formed on the cathode 16, and the whole device is sealed with a sealing substrate (not shown).

The anode 12 has a thickness in a laminating direction (hereinafter simply referred to as thickness) of, for example, 200 nm, and comprises silver or an alloy including silver, because silver, which has highest reflectance of all metals, can reduce a loss of light absorption by the anode 12. The anode 12 comprising silver is preferable because it can have the highest reflectance, although the anode 12 comprising an alloy of silver and other metal is more preferable, because chemical stability and processing accuracy of the anode 12 can be enhanced, and the adhesion of the anode 12 to the substrate 11 and the thin film layer for hole injection 13 can be improved. Silver has very high reactivity, low processing accuracy and low adhesion, thereby it is very difficult to handle silver.

A silver content in the alloy is preferably 50% by mass or over, so that the reflectance of the anode 12 can be sufficiently enhanced. As the alloy including silver, for example, an alloy including silver, palladium (Pd) and copper (Cu) is preferable. A palladium content and a copper content in the alloy are preferably within a range, for example, from 0.3% by mass to 1% by mass, because the reflectance can be sufficiently enhanced, and the processing accuracy, the chemical stability and the adhesion can be enhanced.

The thin film layer for hole injection 13 is provided to enhance efficiency of hole injection into the organic layer 15, and comprises a material with a higher work function than that of the anode 12. Moreover, the thin film layer for hole injection 13 has a function as a protective film which prevents silver or the alloy including silver from reacting with oxygen or a sulfur content in air, and mitigates damage to the anode 12 in a manufacturing step after forming the anode 12. Materials of the thin film layer for hole injection 13 include, for example, a metal such as chromium, nickel (Ni), cobalt (Co), molybdenum (Mo), platinum (Pt) or silicon (Si), an alloy including at least one selected from the above metals, or an oxide of any one of the metals or the alloy, a nitride of any one of the metals or the alloy, or a transparent conductive material such as ITO. It is preferable that the thickness of the thin film layer for hole injection 13 is determined depending upon the light transmittance and electrical conductivity of the material. For example, when the thin film layer for hole injection 13 comprises an oxide or a nitride with relatively low electrical conductivity such as chromium oxide (III) ($Cr_2O_3$), the thickness is preferably as thin as, for example, approximately 5 nm. When the thin film layer for hole injection 13 comprises a metal with high electrical conductivity and low transmittance, the thickness is preferably as thin as, for example, a few nm. On the other hand, when the thin film layer for hole injection 13 comprises ITO with high electrical conductivity and high transmittance, the thickness can be as thick as a few nm to a few tens nm.

The insulating layer 14 is provided to secure the insulation between the anode 12 and the cathode 16 and accurately form a light-emitting area in the organic electroluminescence device 10 in a desired shape. The insulating layer 14 comprises an insulating material such as, for example, silicon dioxide ($SiO_3$). The insulating layer 14 has a thickness of, for example, approximately 600 nm, and in the insulating layer 14, an aperture portion 14A is disposed corresponding to a light-emitting area.

The organic layer 15 includes a hole injection layer 15A, a hole transport layer 15B and a luminescent layer 15C, all of which are made of an organic material, laminated in this order from the anode 12. The hole injection layer 15A and the hole transport layer 15B are provided to enhance efficiency of hole injection into the luminescent layer 15C. The luminescent layer 15C emits light by current injection, and an area of the luminescent layer 15C corresponding to the aperture portion 14A of the insulating layer 14 emits light.

The hole injection layer 15A has a thickness of, for example, approximately 30 nm, and is made of 4,4',4"-tris (3-methylphenylphenylamino)triphenylamine (MTDATA). The hole transport layer 15B has a thickness of, for example, approximately 20 nm, and is made of bis[(N-naphthyl)-N-phenyl]benzidine (α-NPD). The luminescent layer 15C has a thickness of, for example, approximately 50 nm, and is made of 8-quinolinol aluminum complex (Alq).

The cathode 16 includes a semi-transparent electrode 16A having semi-transparency to light generated in the luminescent layer 15C, and a transparent; electrode 16B having transmittance for the light generated in the luminescent layer 15C, which are laminated in this order from the organic layer 15. The semi-transparent electrode 16A has a thickness of, for example, approximately 10 nm, and is made of an alloy of magnesium (Mg) and silver (MgAg alloy). The magnesium-silver alloy preferably has a magnesium-to-silver mass ratio of 9 to 1.

The semi-transparent electrode 16A is provided to reflect the light generated in the luminescent layer 15C between the semi-transparent electrode 16A and the anode 12. In other words, the semi-transparent electrode 16A and the anode 12 constitute a resonant portion in a resonator which resonates the light generated in the luminescent layer 15C. It is preferable that such a resonator is constituted, because the light generated in the luminescent layer 150 causes multiple interference to function as a kind of narrow-band filter, and thereby a half-value width of a spectrum of emitted light can be reduced and color purity can be improved.

For that purpose, it is preferable to match a peak wavelength of the narrow-band filter and a peak wavelength of the spectrum of light desired to be emitted. In other words, assuming that a phase shift of reflected light generated in the anode 12 and the semi-transparent electrode 16A is Φ (rad), an optical distance between the anode 12 and the semi-transparent electrode 16A is L, and the peak wavelength of the spectrum of light desired to be emitted from the cathode 16 is λ, the optical distance L preferably satisfies a mathematical formula 1, and in fact, the optical distance L is preferably selected to be a positive minimum value satisfying the mathematical formula 1. Further, in the mathematical formula 1, the units of L and λ may be the same, for example, "nm".

(Mathematical Formula 1)

$$2L/\lambda + \Phi/2\pi = q \quad (q \text{ is an integer})$$

The transparent electrode 16B is provided to reduce electrical resistance of the semi-transparent electrode 16A, and is made of an electrically conductive material having sufficient translucency to the light generated in the luminescent layer 15C. As the material of the transparent electrode 16B, for example, a compound including indium, zinc (Zn) and oxygen is preferable, because the compound can obtain good electrical conductivity even if film formation is carried out at ambient temperature. The transparent electrode 16B preferably has a thickness of, for example, approximately 200 nm.

The organic electroluminescence device 10 can be manufactured according to the following steps, for example.

Figure 2A:
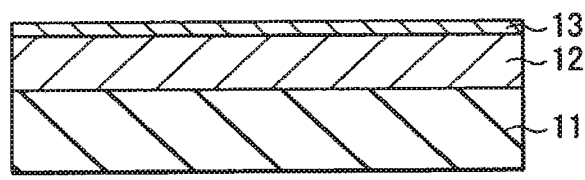
FIGS. 2A through 2C are sectional views showing a method of manufacturing the organic electroluminescence device shown in FIG. 1 in sequence.
Figure 2B:
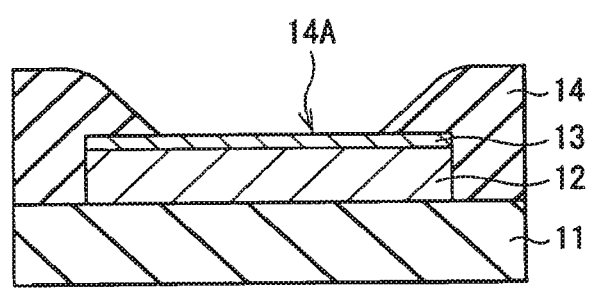
Figure 2C:
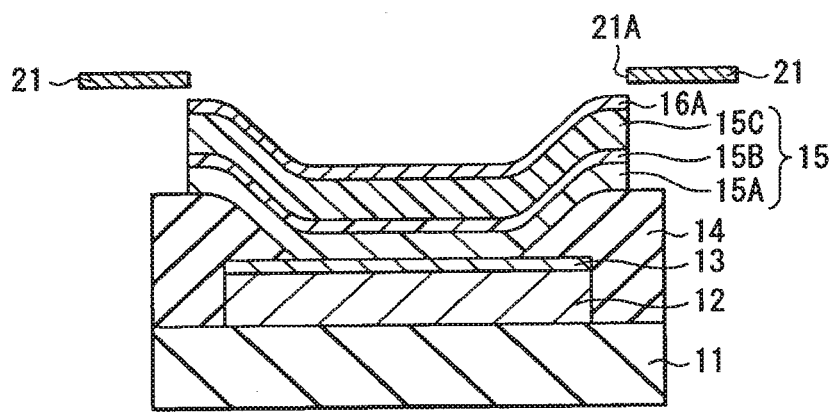

FIGS. 2A through 2C show a method of manufacturing the organic electroluminescence device 10 in sequence. At first, as shown in FIG. 2A, the anode 12 comprising silver or an alloy including silver with the above-described thickness is formed on the substrate 11 made of the above-described material through, for example, direct current sputtering, which is carried out by the use of, for example, argon (Ar) as a sputtering gas at a pressure of, for example, 0.2 Pa and an output of, for example, 300 W.

Next, as shown in FIG. 2A, the thin film layer for hole injection 13 made of the above-described material with the above-described thickness is formed on the anode 12 through, for example, high frequency sputtering. At this time, the thin film layer for hole injection 13 is preferably formed at a pressure of, for example, 0.3 Pa and an output of, for example, 10 W in an atmosphere of an inert gas using an inert gas of argon (Ar), nitrogen ($N_2$) or the like as a sputtering gas. The reactivity of silver comprised in the anode 12 is high, so when the thin film layer for hole injection 13 is formed in an atmosphere of oxygen, the anode 12 is also oxidized. Therefore, the thin film layer for hole injection 13 made of an oxide such as, for example, chromium oxide is preferably formed not in an atmosphere of oxygen using a metal target such as a chromium target but in an atmosphere of an inert gas using an oxide target such as chromium oxide.

Next, as shown in FIG. 2B, the anode 12 and the thin film layer for hole injection 13 are selectively etched through lithography by, for example, a mixed solution of nitric acid, phosphoric acid and acetic acid to be patterned in predetermined shapes. After that, as shown in FIG. 2B, the insulating layer 14 with the above-described thickness is formed all over the substrate 11 through CVD (chemical vapor deposition), and an area of the insulating layer 14 corresponding to a light-emitting area is selectively removed through, for example, lithography to form the aperture portion 14A.

After forming the insulating layer 14, as shown in FIG. 2C, the hole injection layer 15A, the hole transport layer 15B, the luminescent layer 15C and the transparent electrode 16A all of which are made of the above-described materials with the above-described thicknesses are formed in order through, for example, vapor deposition. At this time, by the use of a metallic area mask 21 with an aperture 21A corresponding to an area where the layers are intended to be formed, the layers are preferably formed corresponding to the light-emitting area, that is, the aperture portion 14A of the insulating layer 14. However, it is difficult to carry out vapor deposition only on the aperture portion 14A with high accuracy, so the layers are preferably formed on the whole aperture portion 14A and an edge of the insulating layer 14 around the aperture portion 14A.

More specifically, at first, 0.2 g each of the materials of the hole injection layer 15A, the hole transport layer 15B and the luminescent layer 150 are filled in, for example, respective boats for resistance heating, and the boats are mounted on predetermined electrodes of a vacuum deposition apparatus (not shown). For example, regarding magnesium and silver forming the semi-transparent electrode 16A, 0.1 g of magnesium and 0.4 g of silver are filled in respective boats for resistance heating, and the boats are mounted on predetermined electrodes of the vacuum deposition apparatus (not shown). Further, as a cathode of the vacuum deposition apparatus (not shown), for example, an alloy of magnesium and silver is used. Next, after an pressure of an atmosphere in the vacuum deposition apparatus (not shown) is reduced to, for example, $1.0 \times 10^{-4}$ Pa, a voltage is applied to each boat for resistance heating to heat in order, thereby the hole injection layer 15A, the hole transport layer 15B, the luminescent layer 15C and the semi-transparent electrode 16A are deposited in order. When the semi-transparent electrode 16A is deposited, magnesium and silver are deposited together, and a growth rate ratio of magnesium to silver is set at, for example, 9:1.

Finally, the transparent electrode 16B is formed on the semi-transparent electrode 16A by the use of the same metallic mask 21 through, for example, direct current sputtering, which is carried out by the use of a mixed gas of argon and oxygen (a volume ratio of $Ar:O_2=1000:5$) as a sputtering gas at a pressure of, for example, 0.3 Pa, and an output of, for example, 40 W. Thereby, the organic electroluminescence device 10 shown in FIG. 1 is formed.

In the organic electroluminescence device 10, when a predetermined voltage is applied between the anode 12 and the cathode 16, a current is injected into the luminescent layer 15C to re-bond holes and electrons, thereby light is emitted mainly from an interface on a side of the luminescent layer 15C. The light is multiply reflected between the anode 12 and the semi-transparent electrode 16A, and then passes through the cathode 16 to be emitted. In the embodiment, the anode 12 comprises silver or an alloy including silver, so reflectance of the anode 12 is enhanced. Thereby, the light generated in the luminescent layer 15C is efficiently emitted.

Thus, according to the embodiment, the anode 12 comprises silver or an alloy including silver, so the reflectance of the anode 12 can be enhanced, and a loss of light absorption by the anode 12 can be reduced. Thereby, efficiency of emitting the light generated in the luminescent layer 15C can be improved.

More specifically, the anode 12 comprising an alloy including silver, palladium and copper allows improving the chemical stability, the processing accuracy and the adhesion. Further, when the silver content in the alloy is 50% by mass or over, the reflectance can be sufficiently enhanced, and the chemical stability, the processing accuracy and the adhesion can be improved.

Moreover, when the thin film layer for hole injection 13 made of a material with a higher work function than that of the anode 12 is disposed between the anode 12 and the organic layer 15, the efficiency of hole injection into the organic layer 15 can be further enhanced. Further, silver or an alloy including silver comprised in the anode 12 can be prevented from reacting with oxygen or a sulfur content in air, and damage to the anode 12 in a manufacturing process after forming the anode 12 can be mitigated.

In addition, in the case where the thin film layer for hole injection 13 is formed in an atmosphere of an inert gas, even if the anode 12 comprises silver with high reactivity or an alloy including silver, the anode 12 can be prevented from being deteriorated such as oxidation during the formation of the thin film layer for hole injection 13. Thus, target properties of the anode 12 can be obtained, and thereby the organic electroluminescence device 10 according to the embodiment can be easily obtained.

Modification

Figure 3A:
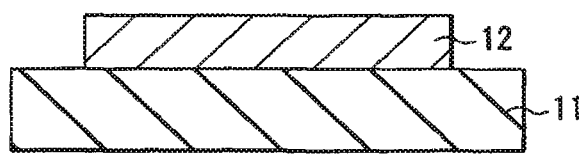
FIGS. 3A and 3B are sectional views showing a modification of a method of the organic electroluminescence device according to the first embodiment in sequence.
Figure 3B:
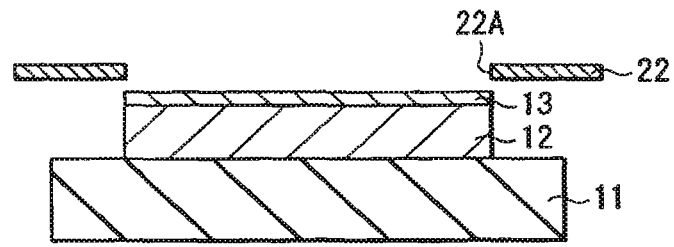

FIGS. 3A and 3B show a modification of a method of manufacturing the organic electroluminescence device 10 according to the first embodiment. In the modification, the thin film layer for hole injection 13 is formed by the use of an area mask 22, thereby the thin film layer for hole injection 13 is not required to be patterned through lithography or the like.

At first, as shown in FIG. 3A, as described above, the anode 12 is formed on the substrate 11, and then is patterned. Next, as shown in FIG. 3B, through, for example, high frequency sputtering, by the use of the area mask 22 with an aperture 22A corresponding to an area where the thin film layer for hole injection 13 is intended to be formed, the thin film layer for hole injection 13 is formed only on desired part, that is, on the patterned anode 12. The conditions of film formation such as the sputtering gas and so on are the same as those in the first embodiment. Then, as in the case of the first embodiment, the insulating layer 14, the organic layer 15 and the cathode 16 are formed.

Thus, according to the modification, the thin film layer for hole injection 13 is formed by the use of the area mask 22, it is not required to pattern the thin film layer for hole injection 13 through lithography or the like. Therefore, even if the anode 12 comprises silver with high reactivity or an alloy including silver, the anode 12 can be prevented from being etched too much during etching to pattern the thin film layer for hole injection 13, or being deteriorated. Thereby, the patterning accuracy of the anode 12 can be improved, and target properties of the anode 12 can be obtained. In other words, the organic electroluminescence device according to the embodiment can be easily obtained.

Second Embodiment

Figure 4:
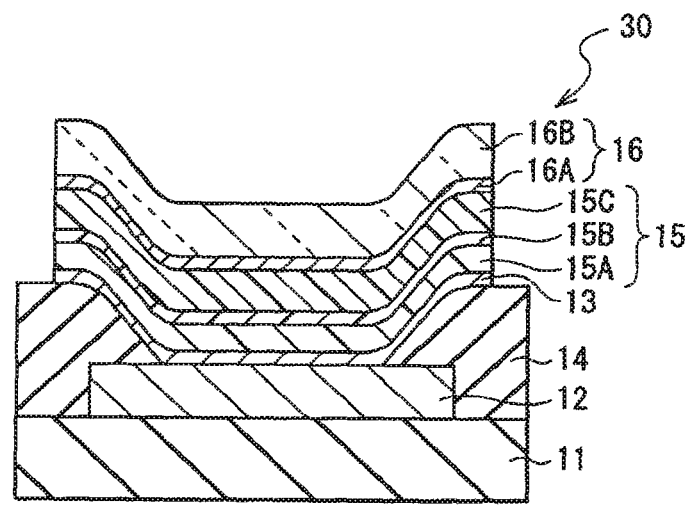
FIG. 4 is a sectional view of a configuration of an organic electroluminescence device according to a second embodiment of the invention.

FIG. 4 shows a sectional configuration of an organic electroluminescence device according to a second embodiment of the invention. An organic electroluminescence device 30 is equivalent to the organic electroluminescence device 10 described in the first embodiment, except that the thin film layer for hole injection 13 is disposed on the anode 12 and the insulating layer 14. Therefore, like components are denoted by like numerals as of the first embodiment and will not be further explained.

Figure 5A:
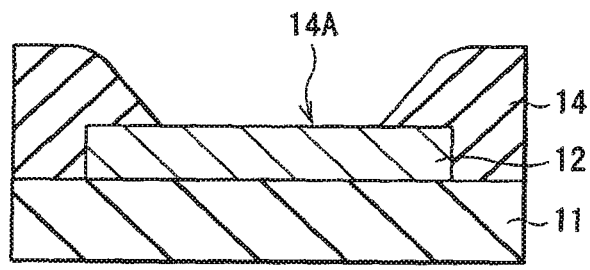
FIGS. 5A and 5B are sectional views showing a method of manufacturing the organic electroluminescence device shown in FIG. 4 in sequence.
Figure 5B:
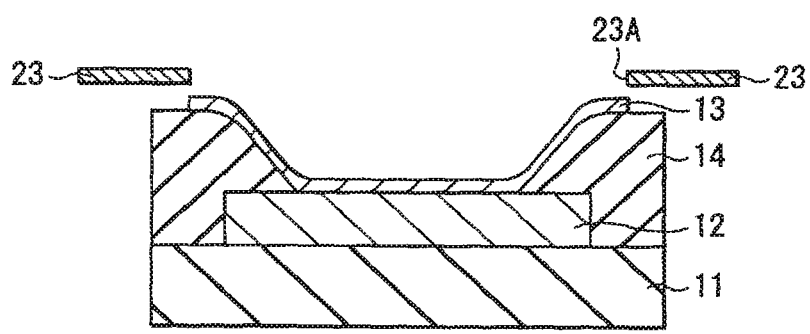
Figure 6:
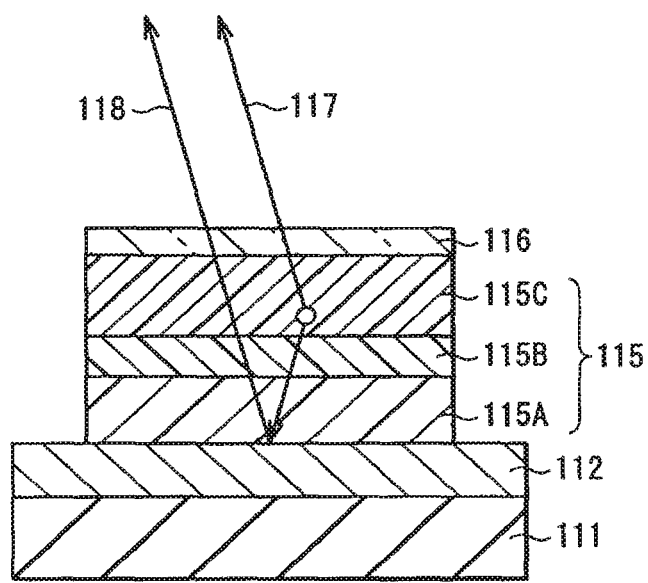
FIG. 6 is a sectional view of a configuration of a conventional organic electroluminescence device.

FIGS. 5A and 5B show a method of manufacturing the organic electroluminescence device 30 in sequence. At first, as shown in FIG. 5A, as in the case of the first embodiment, on the substrate 11, the anode 12 is formed, and then is patterned in a predetermined shape through, for example, lithography. Next, as shown in FIG. 5A, as in the case of the first embodiment, the insulating layer 14 is formed all over the anode 12 and the substrate 11, and the aperture portion 14A is formed. Next, as shown in FIG. 5B, by the use of an area mask 23 with an aperture 23A corresponding to an area where the thin film layer for hole injection 13 is intended to be formed, as in the case of the first embodiment, the thin film layer for hole injection 13 is formed. At this time, the thin film layer for hole injection 13 is laid on the whole aperture portion 14A and an edge of the insulating layer 14 around the aperture portion 14A. After that, by the use of the same area mask 23, as in the case of the first embodiment, the organic layer 15 and the cathode 16 are formed.

Thus, according to the embodiment, the thin film layer for hole injection 13 is formed by the use of the area mask 23, so the embodiment provides the effects equal to those of the above modification.

Moreover, specific examples of the invention will be described below.

In a manner similar to the first embodiment, the modification of the first embodiment and the second embodiment, the organic electroluminescence devices were manufactured. At that time, the anode 12 comprised an alloy including 98% by mass of silver, 1% by mass of palladium and 1% by mass of copper, and the thin film layer for hole injection 13 comprised chromium oxide (III) ($Cr_2O_3$). When the light-emitting efficiencies of the organic electroluminescence devices were determined at an intensity of 1000 ($cd/m^2$), a voltage of 6.47 (V) and a current of 0.341 (mA), all of them were approximately 11.7 (cd/A).

As a comparative example with respect to the examples, in a manner similar to the examples, an organic electroluminescence device was formed. The organic electroluminescence device was equivalent to the examples except that like a conventional one, the anode comprised chromium, and the thin film layer for hole injection was not formed. The light-emitting efficiency of the organic electroluminescence device of the comparative example determined at an intensity of 1000 ($cd/m^2$), a voltage of 7.16 (V) and a current of 0.69 (mA) was 5.86 (cd/A).

Thus, the examples could obtain approximately twice higher light-emitting efficiency than that of the comparative example. In other words, it turned out that the anode 12 comprising silver could enhance the reflectance thereof, thereby resulting in improved properties.

The invention is described referring to the embodiments. However, the invention is not limited to the above embodiment, but is applicable to various modifications. For example, the invention is not limited to the materials and thickness of each layer or the method and conditions of film formation described in the above embodiments, but any other materials and thickness or any other method and conditions of film formation may be applicable.

In the above embodiments, the configurations of the organic electroluminescence device are described in detail, but all layers such as the thin film layer for hole injection 13, the insulating layer 14 or the transparent electrode 16B may not be necessarily comprised, and any other layer may be further comprised. In addition, although the invention can be applied to the case where the semi-transparent electrode 16A is not comprised, an object of the invention is to enhance the reflectance of the anode 12, so the case where the semi-transparent electrode 16A and the anode 12 constitute a resonant portion in a resonator can obtain a higher effect.

As described above, in the organic electroluminescence device according to the invention, the anode comprises silver or an alloy including silver, so the reflectance of the anode can be enhanced, and a loss of light absorption by the anode can be reduced. Thereby, the efficiency of emitting light generated in the luminescent layer can be improved.

Specifically, in the organic electroluminescence device according to the invention, the anode comprises an alloy including silver, palladium and copper, so the chemical stability, the processing accuracy and the adhesion of the anode can be improved, thereby resulting in further improved properties.

Moreover, in the organic electroluminescence device according to the invention, the silver content in the anode is 50% by mass or over, so while the reflectance can be sufficiently enhanced, the chemical stability, the processing accuracy and the adhesion can be improved, thereby resulting in further improved properties.

Further, in the organic electroluminescence device according to the invention, the thin film layer for hole injection with a higher work function than that of the anode is disposed between the anode and the organic layer, so the efficiency of hole injection into the organic layer can be enhanced. Further, silver or an alloy including silver comprised in the anode can be prevented from reacting with oxygen or a sulfur content in air, and can mitigate damage to the anode in a manufacturing step after forming the anode.

In a Method of manufacturing the organic electroluminescence device according to the invention, the thin film layer for hole injection is formed in an atmosphere of an inert gas, so even if the anode comprises silver with higher reactivity or an alloy including silver, the anode can be prevented from being deteriorated such as oxidation during the formation of the thin film layer for hole injection. Therefore, target properties of the anode can be obtained, and thereby the organic electroluminescence device according to the invention can be easily obtained.

Moreover, in a method of manufacturing organic electroluminescence device according to the invention, the thin film layer for hole injection is formed by the use of the area mask, so the thin film layer for hole injection is not required to be patterned through lithography or the like. Therefore, even if the anode comprises silver with high reactivity or an alloy including silver, the anode can be prevented from being etched too much during etching to pattern the thin film layer for hole injection or from being deteriorated. Thereby, while the patterning accuracy of the anode can be improved, target properties of the anode can be obtained. In other words, the organic electroluminescence device according to the invention can be easily obtained.

Obviously many modifications and variations of the present invention are possible in the light of the above teachings. It is therefore to be understood that within the scope of the appended claims the invention may be practiced otherwise than as specifically described.

The invention claimed is:

1. An organic electroluminescence device, comprising:
an anode that includes silver, the anode generally extending in a horizontal direction, parallel to a substrate and perpendicular to a thickness direction of the anode;
a first hole injection layer provided over the anode, the first hole injection layer generally extending in the horizontal direction and includes ITO (Indium Tin Oxide);
organic layers including a luminescent layer; and
a cathode provided over the organic layers, wherein
the organic electroluminescence device is configured to emit light generated in the luminescent layer from a side of the cathode,
the cathode extends generally in the horizontal direction in a light emission region,
the cathode includes a first surface that faces the organic layers and a second surface opposite the first surface,
an end portion of the anode and an end portion of the first hole injection layer are covered by an insulating layer, an upper surface of the insulating layer extending along a first angled upward direction between the horizontal direction and the thickness direction of the anode, and the upper surface of the insulating layer has a curved portion,
outer regions of the organic layers and the cathode over the end portion of the anode extend at the curved portion along a second angled upward direction between the horizontal direction and the first angled upward direction, and
in the curved portion over the end portion of the anode, the first surface of the cathode and the second surface of the cathode both extend along the second angled upward direction.

2. The organic electroluminescence device according to claim 1, wherein the anode includes an alloy including silver, the silver constituting 50% or greater but less than 100% by mass of the alloy.

3. The organic electroluminescence device according to claim 1, wherein the anode includes 50% by mass or greater of silver.

4. The organic electroluminescence device according to claim 1, wherein the first hole injection layer is made of a material with a higher work function than that of the anode.

5. The organic electroluminescence device according to claim 1, wherein the first hole injection layer is disposed directly on an upper surface of the anode.

6. The organic electroluminescence device according to claim 1, further wherein an insulating layer is formed surrounding the sides of the anode and partially covering end portions of the top surface of the anode.

7. The organic electroluminescence device according to claim 1, wherein a thickness of the first hole injection layer is from a few nm to a few tens of nm.

8. The organic electroluminescence device according to claim 2, wherein the anode further includes palladium (Pd).

9. The organic electroluminescence device according to claim 2, wherein the anode further includes copper (Cu).

10. The organic electroluminescence device according to claim 8, wherein the anode includes from 0.3% by mass to 1% by mass of palladium (Pd).

11. The organic electroluminescence device according to claim 9, wherein the anode includes from 0.3% by mass to 1% by mass of copper (Cu).

12. A display device, comprising an organic electroluminescence device, the organic electroluminescence device including:
   an anode that includes silver, the anode generally extending in a horizontal direction, parallel to a substrate and perpendicular to a thickness direction of the anode;
   an ITO (Indium Tin Oxide) layer provided over the anode, the ITO layer generally extending in the horizontal direction;
   organic layers including a luminescent layer; and
   a cathode provided over the organic layers, wherein
      the organic electroluminescence device is configured to emit light generated in the luminescent layer from a side of the cathode,
      the cathode extends generally in the horizontal direction in a light emission region,
      the cathode includes a first surface that faces the organic layers and a second surface opposite the first surface,
      an end portion of the anode and an end portion the ITO layer are covered by an insulating layer, an upper surface of the insulating layer extending along a first angled upward direction between the horizontal direction and the thickness direction of the anode, and the upper surface of the insulating layer has a curved portion,
      outer regions of the organic layers and the cathode over the end portion of the anode extend at the curved portion along a second angled upward direction between the horizontal direction and the first angled upward direction, and
      in the curved portion over the end portion of the anode, the first surface of the cathode and the second surface of the cathode both extend along the second angled upward direction.

13. The display device according to claim 12, wherein the anode includes an alloy including silver, the silver constituting 50% or greater but less than 100% by mass of the alloy.

14. The display device according to claim 12, wherein the anode includes from 0.3% by mass to 1% by mass of palladium (Pd).

15. The display device according to claim 12, wherein the anode includes from 0.3% by mass to 1% by mass of copper (Cu).

16. The display device according to claim 12, wherein the anode includes 50% by mass or greater of silver.

17. The display device according to claim 12, wherein a work function of the ITO is higher than that of the anode.

18. The display device according to claim 12, further wherein the ITO layer is disposed directly on an upper surface of the anode.

19. The display device according to claim 12, further wherein an insulating layer is formed surrounding the sides of the anode and partially covering end portions of the top surface of the anode.

20. The display device according to claim 12, wherein a thickness of the ITO layer is from a few nm to a few tens of nm.

21. The display device according to claim 12, wherein a total thickness of the organic layers is dependent on a peak wavelength of a spectrum of light emitted from the luminescent layer.

22. The display device according to claim 12, wherein the cathode includes silver.

23. The display device according to claim 21, wherein the cathode comprises a semi-transparent electrode being semi-transparent to light generated in the luminescent layer, and the semi-transparent electrode and the anode constitute a resonant portion in a resonator resonating light generated in the luminescent layer.

24. The display device according to claim 23, wherein a phase shift of reflected light generated in the anode and the semi-transparent electrode is $\Phi$, an optical distance between the anode and the semi-transparent electrode is L, and the peak wavelength is $\lambda$, the optical distance L is a positive minimum value satisfying a mathematical formula:

$$2L/\lambda + \Phi/2\pi = q$$

where q is an integer.

* * * * *